(12) United States Patent
Lee et al.

(10) Patent No.: US 9,543,441 B2
(45) Date of Patent: Jan. 10, 2017

(54) METHODS, APPARATUS AND SYSTEM FOR FABRICATING HIGH PERFORMANCE FINFET DEVICE

(71) Applicant: GLOBALFOUNDRIES Inc., Grand Cayman (KY)

(72) Inventors: Ki Young Lee, Poughquang, NY (US); Byoung-Gi Min, Cohoes, NY (US); Kijik Lee, Gansevoort, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/645,121

(22) Filed: Mar. 11, 2015

(65) Prior Publication Data
US 2016/0268435 A1    Sep. 15, 2016

(51) Int. Cl.
| | | |
|---|---|---|
| H01L 21/20 | (2006.01) | |
| H01L 21/306 | (2006.01) | |
| H01L 29/78 | (2006.01) | |
| H01L 27/085 | (2006.01) | |
| H01L 29/66 | (2006.01) | |
| H01L 21/324 | (2006.01) | |
| H01L 21/02 | (2006.01) | |
| H01L 29/06 | (2006.01) | |

(52) U.S. Cl.
CPC ....... *H01L 29/7853* (2013.01); *H01L 21/0262* (2013.01); *H01L 21/02521* (2013.01); *H01L 21/02529* (2013.01); *H01L 21/02532* (2013.01); *H01L 21/324* (2013.01); *H01L 29/0653* (2013.01); *H01L 29/0692* (2013.01); *H01L 29/66795* (2013.01); *H01L 29/66818* (2013.01)

(58) Field of Classification Search
CPC ............. H01L 29/7853; H01L 29/0653; H01L 29/0692; H01L 29/66795; H01L 29/66818; H01L 21/0262; H01L 21/02521; H01L 21/02529; H01L 21/02532; H01L 21/324
USPC ..... 257/9, 77, 192, 288, 337, 401, 616, 618, 257/E29.104, E27.059, E27.112, 257/E21.09, E21.561; 438/283, 285, 478, 438/479, 493
See application file for complete search history.

(56) References Cited

U.S. PATENT DOCUMENTS

| | | | | |
|---|---|---|---|---|
| 7,851,790 | B2* | 12/2010 | Rachmady | B82Y 10/00 257/250 |
| 8,722,478 | B2* | 5/2014 | Jin | B82Y 10/00 438/151 |
| 8,957,476 | B2* | 2/2015 | Glass | H01L 21/82343 257/337 |
| 9,257,556 | B2* | 2/2016 | Xu | H01L 29/66795 |
| 2011/0147811 | A1* | 6/2011 | Kavalieros | H01L 29/66795 257/288 |
| 2012/0309173 | A1* | 12/2012 | Shah | B82Y 10/00 438/478 |
| 2013/0193446 | A1* | 8/2013 | Chao | H01L 29/66795 257/77 |
| 2015/0123146 | A1* | 5/2015 | Krishnan | H01L 21/0243 257/77 |

(Continued)

*Primary Examiner* — Dao H Nguyen
(74) *Attorney, Agent, or Firm* — Williams Morgan, P.C.

(57) ABSTRACT

At least one method, apparatus and system disclosed herein fin field effect transistor (finFET) comprising a bulbous fin head. A fin of a gate of a transistor is formed. A first recess step is performed for striping a hard mask material by a first dimension to expose a first portion of the fin. An epitaxy layer is formed upon the first portion. An oxidation process is performed upon the fin. An oxide removal process is performed upon the fin to provide a bulbous shape upon the first portion.

15 Claims, 10 Drawing Sheets

(56) References Cited

U.S. PATENT DOCUMENTS

| | | | |
|---|---|---|---|
| 2015/0132911 A1* | 5/2015 | Wann | H01L 21/82382 438/283 |
| 2016/0005868 A1* | 1/2016 | Wei | H01L 29/7853 257/401 |
| 2016/0276431 A1* | 9/2016 | Wen | H01L 29/0673 |

* cited by examiner

METHODS, APPARATUS AND SYSTEM FOR FABRICATING HIGH PERFORMANCE FINFET DEVICE

BACKGROUND OF THE INVENTION

Field of the Invention

Generally, the present disclosure relates to the manufacture of sophisticated semiconductor devices, and, more specifically, to various methods for fabricating high performance finFET devices.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative FinFET device, which is a 3-dimensional structure. More specifically, in a FinFET, a generally vertically positioned, fin-shaped active area is formed and a gate electrode encloses both of the sides and the upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure.

FinFET designs use "fins" that may be formed on the surface of a semiconductor wafer using selective-etching processes. The fins may be used to form a raised channel between the gate and the source and drain of a transistor. The gate is then deposited such that it wraps around the fin to form a trigate structure. Since the channel is extremely thin, the gate would generally have a greater control over the carriers within. However, when the transistor is switched on, the shape of the channel may limit the current flow. Therefore, multiple fins may be used in parallel to provide greater current flow for increased drive strength.

Figure 1:
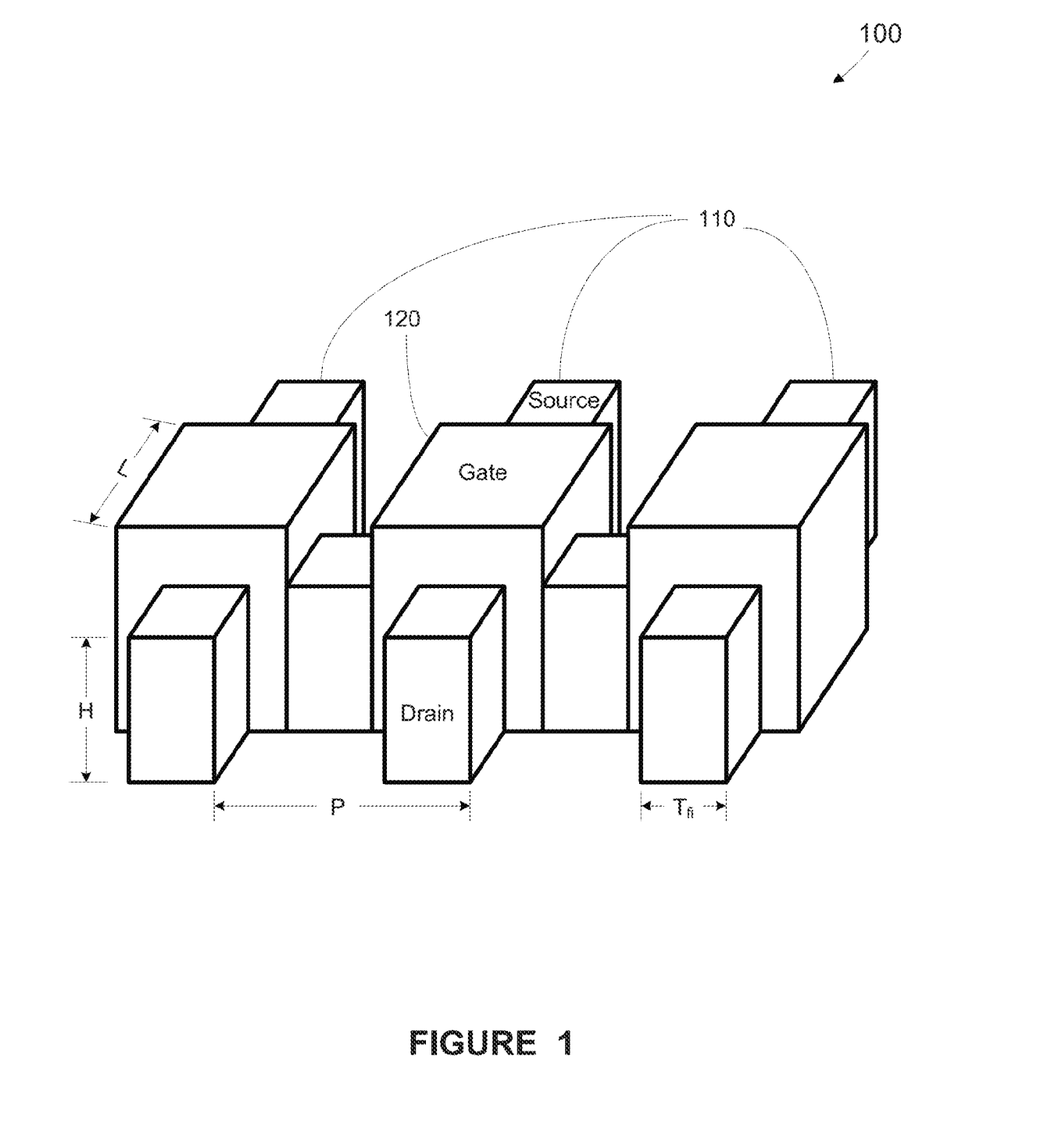
FIG. 1 illustrates a stylized cross-sectional depiction of a state-of-the-art FinFET device.

FIG. 1 illustrates a stylized cross-sectional depiction of a state-of-the-art FinFET device. A FinFET device 100 illustrated in FIG. 1 comprises a plurality of "fins" 110. The semiconductor device may be position to a vertical orientation, creating one or more fins 110. The source and drain of the FinFET are placed horizontally along the fin. A high-k metal gate 120 wraps over the fin, covering it on three sides. The gate 120 defines the length of the FinFET device. The current flow occurs along an orthogonal crystal plane in a direction parallel to the plane of the semiconductor wafer. The electrically significant height of the fin (labeled H) is typically determined by the amount of oxide recess in the fin reveal step and hence is constant for all fins 110.

The thickness of the fin (labeled $T_{fi}$) determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a better packing of the devices per square area resulting in a denser design, or more efficient use of silicon wafer area.

The scaling down of integrated circuits coupled with higher performance requirements for these circuits have prompted an increased interest in finFETs. FinFETs generally have the increased channel widths, which includes channel portions formed on the sidewalls and top portions of the fins. Since drive currents of the finFETs are proportional to the channel widths, finFETs generally display increase drive current capabilities.

Figure 2:
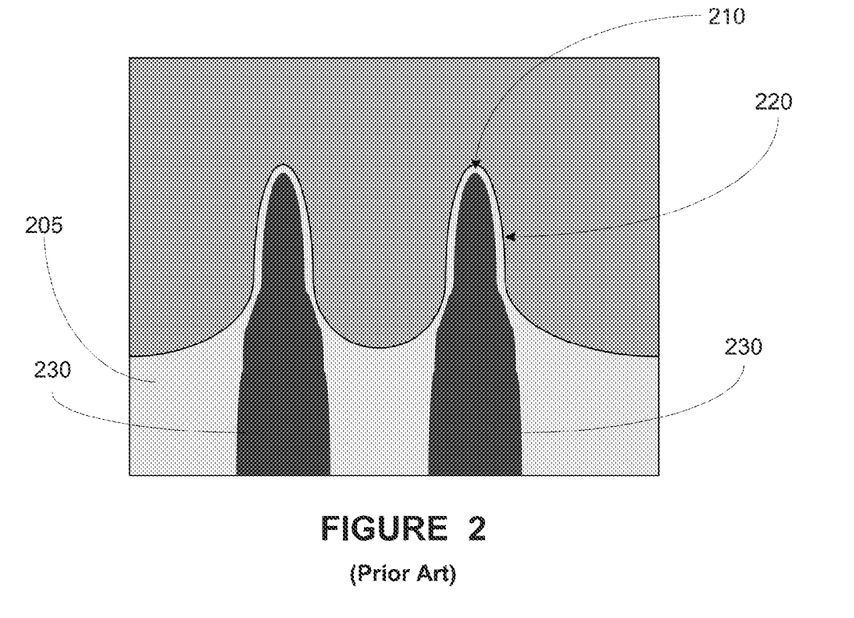
FIG. 2 illustrates a typical set of gate fins of a finFET.

Typically, state of the art finFETs comprise inverted U-shaped fin structures that are formed using oxide recess processes. Since drive currents of the finFETs are proportional to the channel widths, in a quest to increase drive currents, designers have resorted to forming fins of greater heights, i.e., longer U-shaped fins. FIG. 2 illustrates a typical set of gate fins of a finFET. FIG. 2 shows two gate fins 230, generally of an inverted U-shape. The gate fins 230 are formed within an insulation material 205 (e.g., silicon oxide). The top portion 210 and the sidewalls 220 of the gate fins are the active areas of the finFET. Increasing the height of the gate fins 220 would increases the active area, which in turn would increase the current drive of the finFET.

However, the greater height would cause the device to be larger in size, leading to larger sized integrated circuit made from the finFETs. Another problem with the state of the art includes process errors and problems that are created when filling the larger recesses that were created for increasing the height of the gate fins 220. Filling the larger recess gap with metal material is more problematic from a process standpoint. Still further, processing the larger recess may require an additional mask to prevent depositing metal to other areas of the circuit.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for providing a fin field effect transistor (finFET) comprising a bulbous fin head. A fin of a gate of a transistor is formed. A first recess step is performed for striping a hard mask material by a first dimension to expose a first portion of the fin. An epitaxy layer is formed upon the first portion. An oxidation process is performed upon the fin. An oxide removal process is performed upon the fin to provide a bulbous shape upon the first portion.

BRIEF DESCRIPTION OF THE DRAWINGS

The disclosure may be understood by reference to the following description taken in conjunction with the accompanying drawings, in which like reference numerals identify like elements, and in which:

FIG. 5-16 illustrates various stylized diagrams relating to forming a finFET device, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for increasing at least a portion of an active area of a gate fin in a finFET device. Embodiments herein provide for increasing the active area without increasing the lateral and vertical dimensions of a gate fin. Accordingly, embodiments herein provide for increased drive current without increasing fin height. In this manner, smaller integrated circuit ((IC) chips may be manufactured while retaining device performance. Further, embodiments herein allow for increased device performance, via increased drive currents, and retain similar dimensions of the IC chips housing the finFETs provided by embodiments herein.

Figure 3:
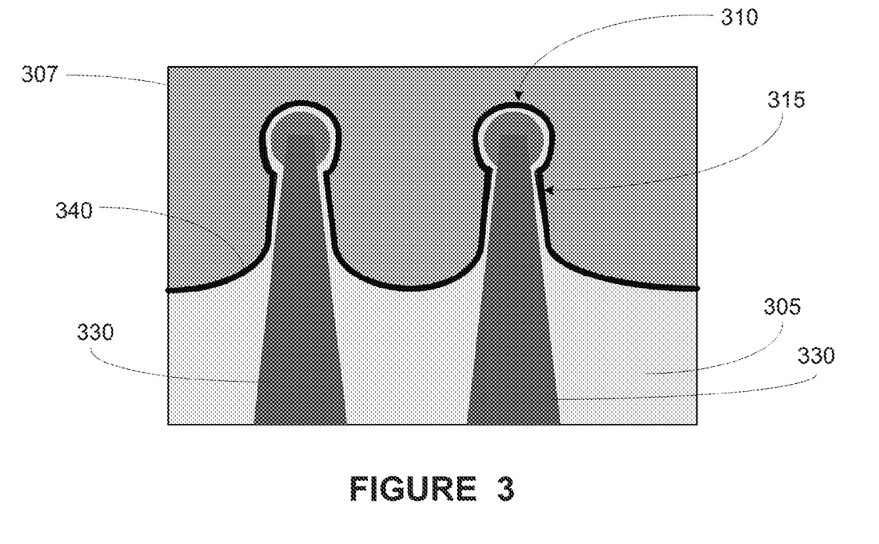
FIG. 3 illustrates a stylized depiction of a plurality of gate fins comprising a circular head and a neck region, in accordance with embodiments herein.

Embodiments herein provide for forming a circular region coupled to a neck region on a gate fin, thereby increasing the active area, which may result in an increased drive current without increasing the height of the gate fin. FIG. 3 illustrates a stylized depiction of a plurality of gate fins comprising a circular head and a neck region, in accordance with embodiments herein. FIG. 3 shows two gate fins 330 (e.g., metal gates) formed within an insulating material (e.g., gate oxide material 305) and covered in tungsten material 307. The gate fins 330 comprise a rounded or bulbous head region 310 and a neck region 315. The rounded head region 310 and the sidewalls of the fins 330 are part of the active area of the finFET. The curved line 340 represents the active region, which in one embodiment, may consist of general silicon oxide film, or in another embodiment, may consist of high-K gate oxide material, such as $HFO_2$. In one embodiment, curved line 340 representing the active region may be positioned at a uniform gap from the fin 330. The rounded head region 310 and/or the neck region 315 provide for a longer line 340, which provides an increased active region, which in turn, provides for higher drive current of the finFET.

In this manner, higher current drive is achieved without having to increase the size of the finFETs 330. Therefore, higher performance IC devices may be formed without increasing the size of the IC devices. Further, gate fins 330 of lower height may be manufacturing using methods provided in embodiments herein and maintain similar current drive. Therefore, IC devices of similar performance may be manufactured while decreasing the size of the IC devices.

Figure 4:
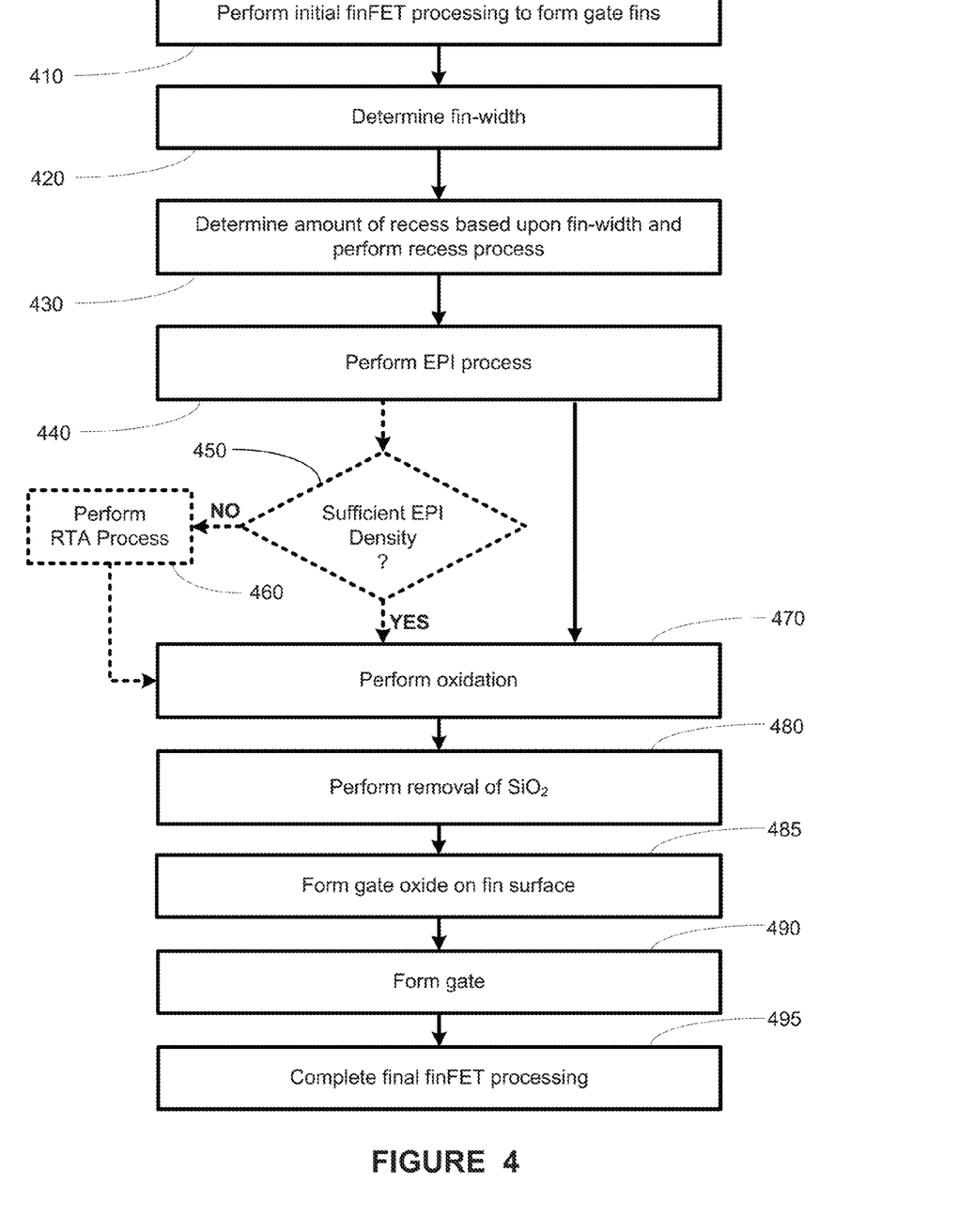
FIG. 4 illustrates a flowchart depiction of a method for forming finFET having a greater active area, in accordance with embodiments herein.

Turning now to FIG. 4, a flowchart depiction of a method for forming finFET having a greater active area, in accordance with embodiments herein, is illustrated. A semiconductor wafer processing system may perform an initial finFET processing protocol for forming gate fins (block 410). The fin width of the gate fins may be determined (block 420). The fin width may depend on various factors, such as current drive requirement, device dimension requirements, etc. Based upon the fin width, the amount of recess of the hard mask material covering the fins is determined, and at least a partial recess process is performed (block 430). As described in further details below, the amount of recess may be directly proportional to the fin width.

Once at least a partial recess process is completed, an epitaxial growth/deposition process is performed on the gate fins (block 440). Subsequently, an oxidization process (e.g., using SiO$_2$) may be performed (block 470).

As an alternative step, as an optional process of determining whether the epitaxial layer is sufficiently dense is performed (block 450). If the epitaxial layer is not sufficiently dense, a rapid thermal annealing (RTA) process is performed (block 460) to increase the density of the epitaxial layer to a desired level. The optional steps of block 450 and 460 are indicated with dotted lines and blocks. In many embodiments, the RTA process may be performed subsequent to the EPI process.

The oxidization process (block 460) may transform the epitaxial layer from a diamond shape to a round/bulbous shape. Subsequently, the SiO$_2$ material is removed, e.g., using an etch process (block 480). A gate oxide is then formed on the fin surface (block 485) and the gate is then formed (block 490), which results in gate fins comprising a rounded head and a neck, thereby increasing the active are of the gate fins.

In one embodiment, as described in further details below, a first recess process may be performed to expose the gate fin end region to form the epitaxial layer (i.e., head region). Once the epitaxial layer is formed, a second recess process may be performed to expose a neck portion of the gate fin (below the head portion). The head region and the neck region provide for a greater active area on the gate fin. Subsequently, normal finFET processing steps known to those skilled in the art having benefit of the present disclosure is performed to manufacture the finFET (block 495).

Figure 5:
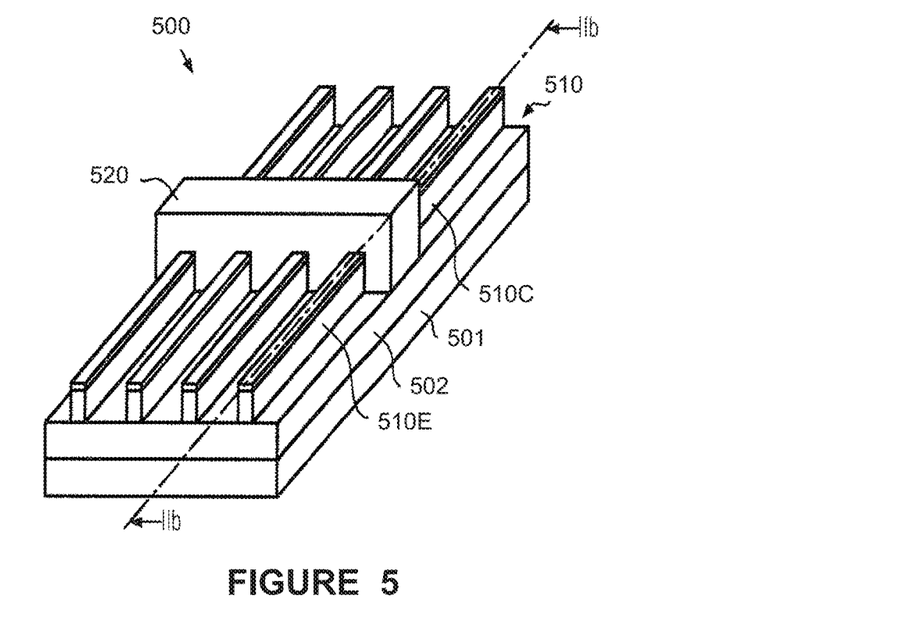

FIG. 5-16 illustrates various stylized diagrams relating to forming a finFET device, in accordance with embodiments herein. FIG. 5 schematically illustrates a perspective view of a semiconductor device 500, which may also be referred to as multiple gate transistor, since at least two separate channel regions may be controlled by respective portions of a gate electrode. In the manufacturing stage shown, the device 500 may comprise a substrate 501, such as a silicon substrate or any other appropriate carrier material, on which may be formed an appropriate base layer 502, which, in some illustrative embodiments, may represent an insulating layer, such as a silicon dioxide layer, a silicon nitride layer, a silicon oxynitride layer and the like. For example, if the substrate 501 may be comprised of a substantially crystalline semiconductor material, the base layer 502, if provided in the form of an insulating material, and the substrate 501 may define a silicon on insulator (SOI) configuration.

Moreover, a plurality of fins 510 are formed on the layer 502 and comprise respective end portions 510E and a central portion 510C, which is covered by a gate electrode structure 520. Furthermore, a gate insulation material may be formed at least on sidewalls of the fins 510 (not shown in FIG. 5), while a corresponding gate insulation layer may be formed on a top surface of the fins 510 if a tri-gate transistor architecture is considered. In other cases, the fins 510 may be covered by a cap layer (not shown) which may result in an insufficient capacitive coupling to the fins 510, so that the top surface thereof may effectively not act as a channel region. With respect to any material composition of the fins 510, it is to be appreciated that any appropriate material, such as silicon, silicon/germanium, germanium or any other appropriate semiconductor compound may be used, depending on the overall device requirements. Similarly, the corresponding dimensions of the fins 510 may be selected in accordance with the design rules of the corresponding technology node under consideration.

Figure 6:
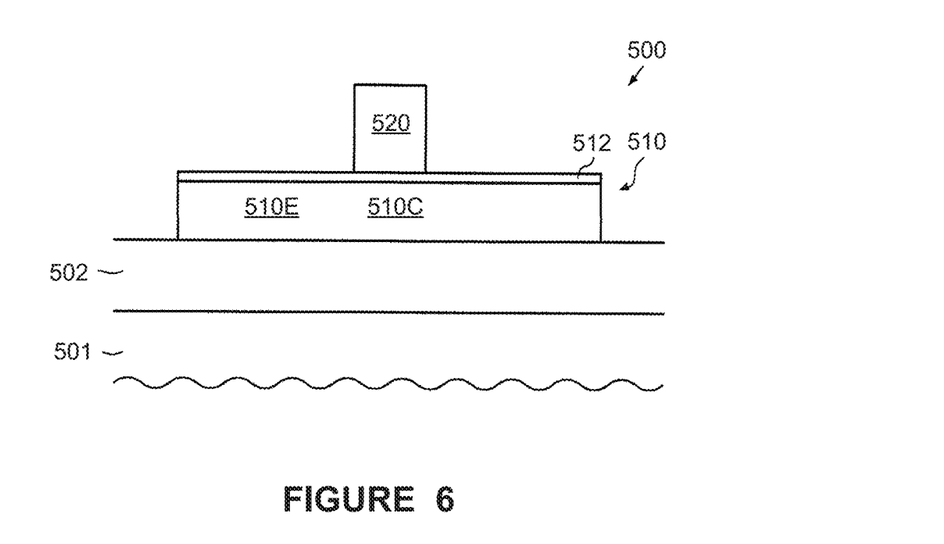

FIG. 6 illustrates a stylized depiction of a cross-sectional view taken along the section Ith of FIG. 5. As illustrated, a cap layer 512, such as a silicon oxide layer or a high-K HFO2 layer. and/or the like, may be formed on the fins 510, and the gate electrode structure 520. The gate electrode structure 520 may be comprised of any appropriate material, such as polysilicon, a metal-containing material and the like, may be formed on the cap layer 512 and may also extend down to the layer 502 along the corresponding sidewalls of a Fin 510 (not shown in the section of FIG. 6). The semiconductor device 500 as shown in FIGS. 5 and 6 may be formed on the basis of well-established process techniques as are, for instance, also explained above with reference to the device 100.

Figure 7:
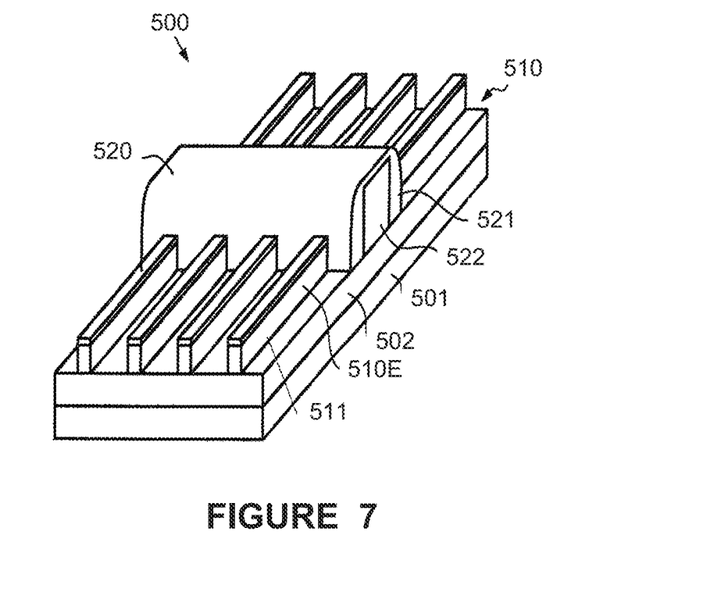

FIG. 7 illustrates a stylized depiction of a perspective view of the transistor 500 in a further advanced manufacturing stage. As illustrated, the gate electrode structure 520 may comprise a sidewall spacer structure 521, which may be comprised of any appropriate material such as silicon nitride, silicon dioxide and the like. The spacer structure may be formed on the basis of well-established deposition and etch techniques, wherein a width of the spacer structure 520 may be selected in accordance with a desired dopant profile in each of the end portions 510E of the Fins 510. That is, moderately high dopant concentration may be established in the end portions 510E adjacent to the gate electrode structure 520, possibly by using an offset spacer element (not shown) and thereafter one or more spacer elements of the structure 521 may be provided and may be used as an implantation mask during one or more subsequent implantation steps to provide the desired high dopant concentration in the end portions 510E with a lateral distance to a gate electrode material 522 of the gate electrode structure 520. It should be appreciated that any appropriate concentration profile extending from the electrode material 522 may be established by appropriately forming a corresponding number of spacer elements in the structure 521. It should further be appreciated that any other implantation processes may be performed, for instance with respect to defining a counter doped area in the vicinity of the central portion 510C, which represents the actual channel region. Drain and source regions 511 may be formed at oppositely positioned end portions 510E having the desired dopant concentration and concentration gradient with respect to the central portion 510C.

Figure 8:
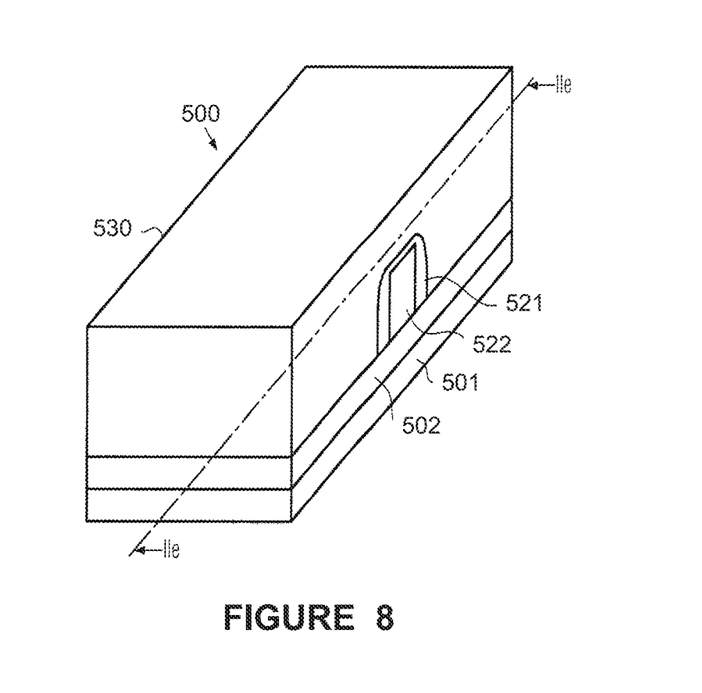

FIG. 8 illustrates a stylized depiction of the semiconductor device 500 in a further advanced manufacturing stage. As illustrated, a dielectric material 530, such as silicon dioxide, silicon nitride, silicon carbide and the like, may be formed above the fins 510 and the gate electrode structure 520. The dielectric material 530 may, in some illustrative embodiments, be comprised of two or more material layers in order to adapt the material characteristics to the further processing of the device 500. For instance, an etch stop liner may be formed and thereafter the actual fill material may be deposited having the desired material characteristics. In other illustrative embodiments, appropriate anti-reflective coating (ARC) materials, hard mask materials and the like may be provided, at least in an upper portion of the dielectric material 530. The deposition of the material 530 may be accomplished on the basis of well-established deposition techniques, such as plasma enhanced chemical vapor deposition (CVD), thermally activated CVD, spin-on techniques, depending on the material characteristics required. For example, materials of reduced relative permittivity may be selected if an increased fringing capacitance or any other parasitic capacitance with respect to additional wiring levels to be formed above the device 500 are considered inappropriate.

Figure 9:
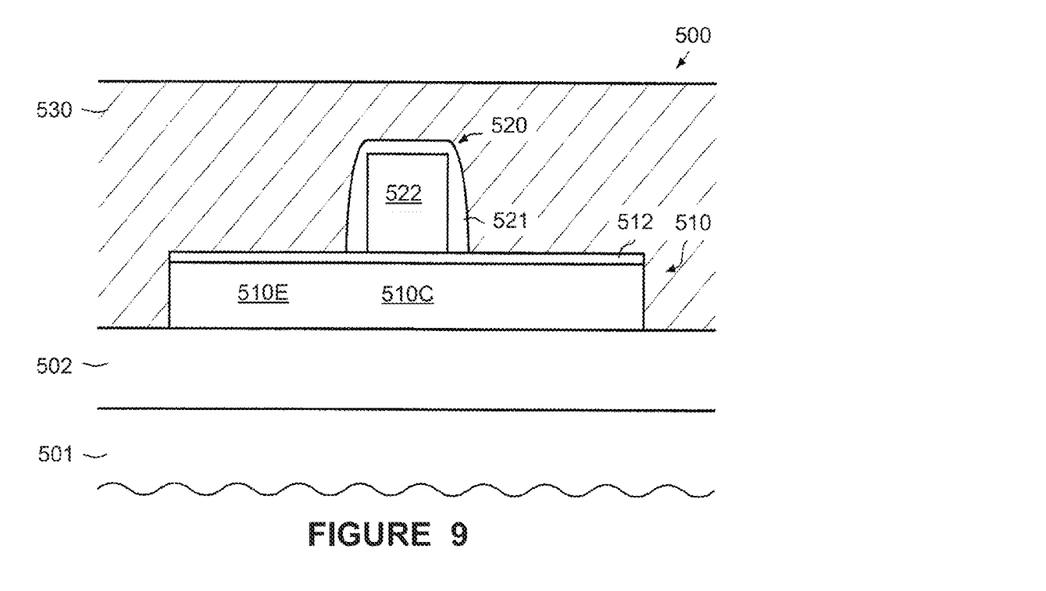

FIG. 9 illustrates a stylized depiction of a cross-sectional view of the device 500 of FIG. 8. As illustrated, the material 530 may enclose the gate electrode structure 520 and the end portions 510E of the Fins 510. After the deposition of the dielectric material 530, a lithography process may be performed to provide an etch mask that defines the lateral position and size of corresponding openings to be formed in the dielectric material 530.

Figure 10:
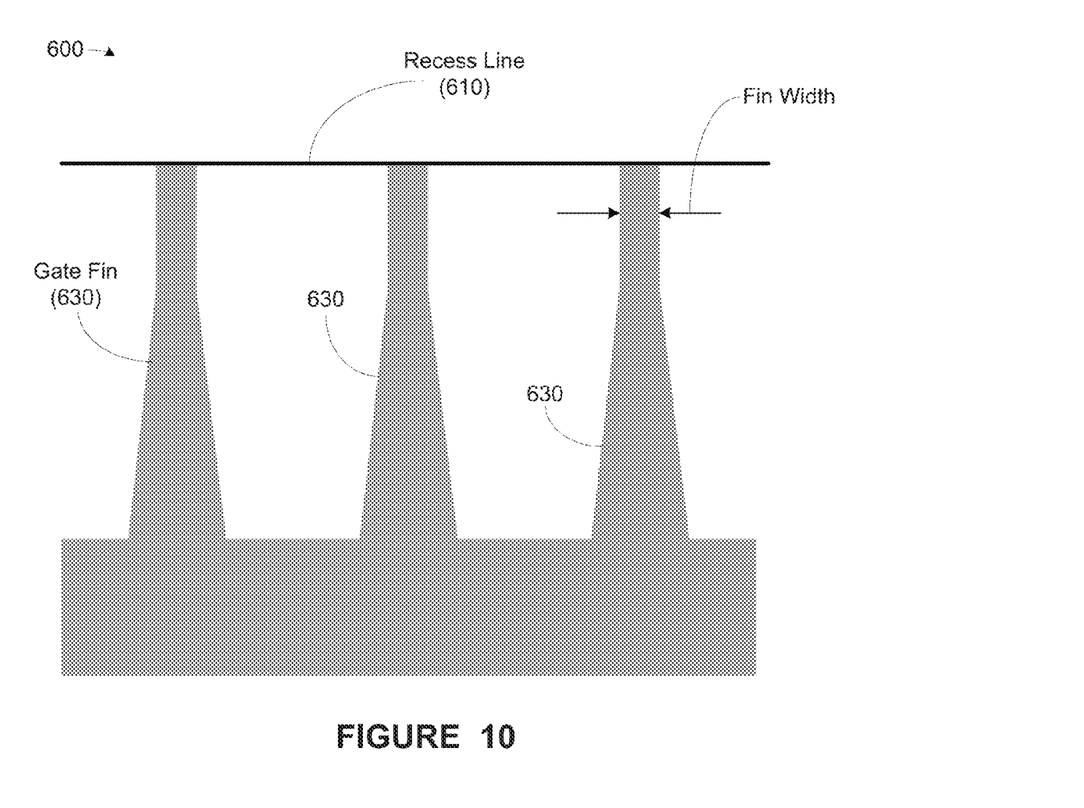
Figure 11:
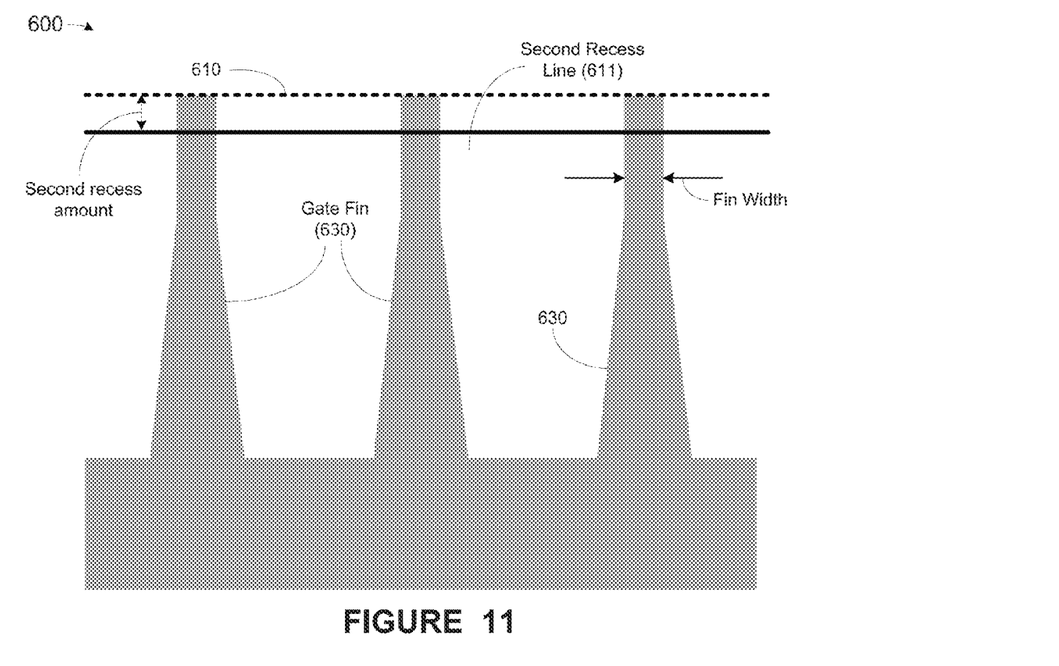

FIGS. 10-17 illustrate stylized depictions of cross-sectional views of a finFET device 600 comprising a plurality of gate fins, in accordance with embodiments herein. The finFET device 600 may be formed using various processes known to those skilled in the art (e.g., processes described above) having benefit of the present disclosure. FIGS. 10-17 illustrate a plurality of gate fins 630. Although only a limited number of fins 660 are illustrated, those skilled in the art would appreciate that a variety of number of fins 660 may be formed on a substrate and remain within the spirit and scope of embodiments herein. FIG. 10 shows the recess line 610 at the top of the gate fins 630 after a hard mask strip process (e.g., strip of silicon nitride). Subsequent to the hard mask strip process, as shown in FIG. 11, a partial recess process (first recess process) may be performed, wherein the recess area is processed down to a second recess line 611, as shown in FIG. 11. In one embodiment, the recess amount may be about 70% to about 140% of the fin width.

In one embodiment, the partial recess process may be performed using a dry etch process, such as a reactive-ion etching (RIE) process. In another embodiment, the recess process may be performed using a wet etch process, such as using hydrofluoric acid (HF) chemical etching. In yet another embodiment, the recess process may comprise a combination of dry etching and wet etching processes. The recess amount is proportional to the fin width. In one embodiment, this process is performed on the device 600 in an un-doped state (i.e., prior to performing doping).

Figure 12:
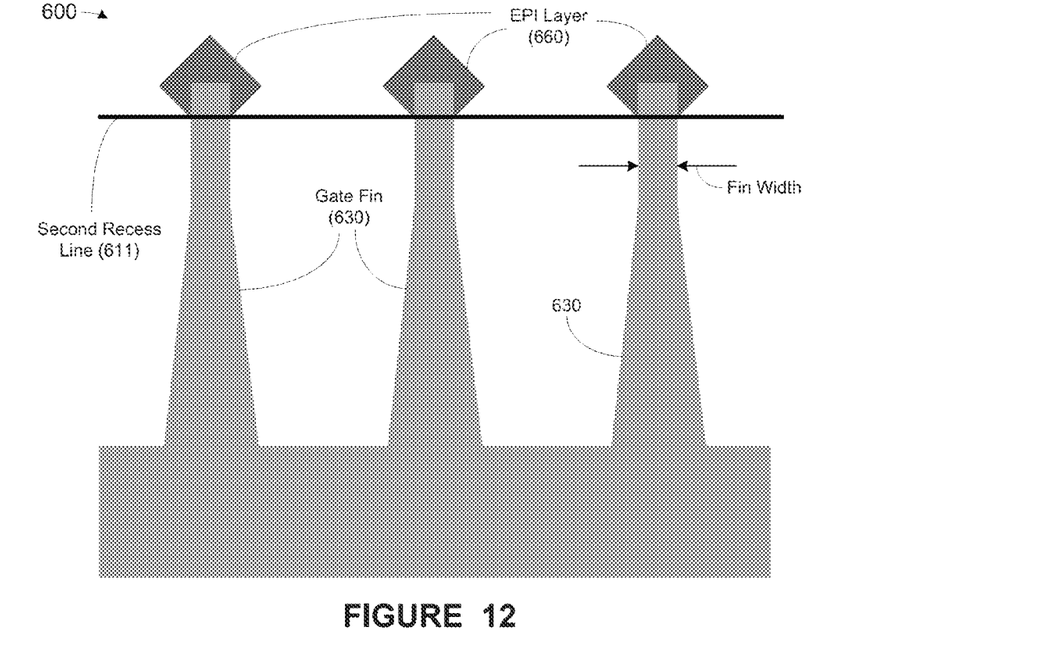

Upon performing the first recess process, an epitaxial growth/deposition process may be performed. FIG. 12 shows epitaxy/epitaxial layers 660 being deposited on the gate fins 630. The epitaxy layer 660 may be epitaxial grown on the exposed portion of the gate fins 630, above the recess line 611. The epitaxy layers 660 may be comprised of a variety of materials, including the same semiconductor material as the gate fins 630, silicon germanium, silicon carbon, silicon phosphate, and/or the like.

In one embodiment, the epitaxy layers 660 may be deposited on un-doped semiconductor material. In one embodiment, the epitaxy layers 660 may be grown to a size of about 5 nm to about 20 nm (lateral EPI width). The epitaxy layers 660 may be deposited using a chemical vapor deposition process (CVD), e.g., reduced pressure CVD (RPCVD), ultra-high vacuum CVD (UHVCVD), metal organic CVD (MOCVD), etc. The precursors for the epitaxy layers 660 may comprise gases comprising silicon (e.g., $SiH_4$, $Si_2H_4Cl_2$, $Si_2H_6$, $Si_3H_8$) and/or gases comprising germanium (e.g., $GeH_4$). The partial pressures of these gases may be adjusted to adjust the atomic ratio of germanium to silicon. In one embodiment, the epitaxy layer may be grown at 700° C., and may be decreased to 550° C. with source gas.

In one embodiment, the lateral width of the epitaxy layers 660 may be proportional to the fin width, wherein the lateral EPI width may be about 100% to about 150% of the fin width. The deposition of the epitaxy layer may be performed as a plurality of deposition-etch cycles to provide an epitaxy layer 660 that is more conformal. As illustrated in FIG. 12, generally, the shape of the epitaxial layers 600 upon deposition may be generally a diamond shape immediately after EPI growth.

A determination may be made as to whether the epitaxial growth is sufficiently dense. If the epitaxy layer 660 is not sufficiently dense, an RTA process may be performed for further add density to the epitaxy layer 660. Subsequent RTA processes may be performed until the densities of the epitaxy layers 660 are deemed satisfactory.

Figure 13:
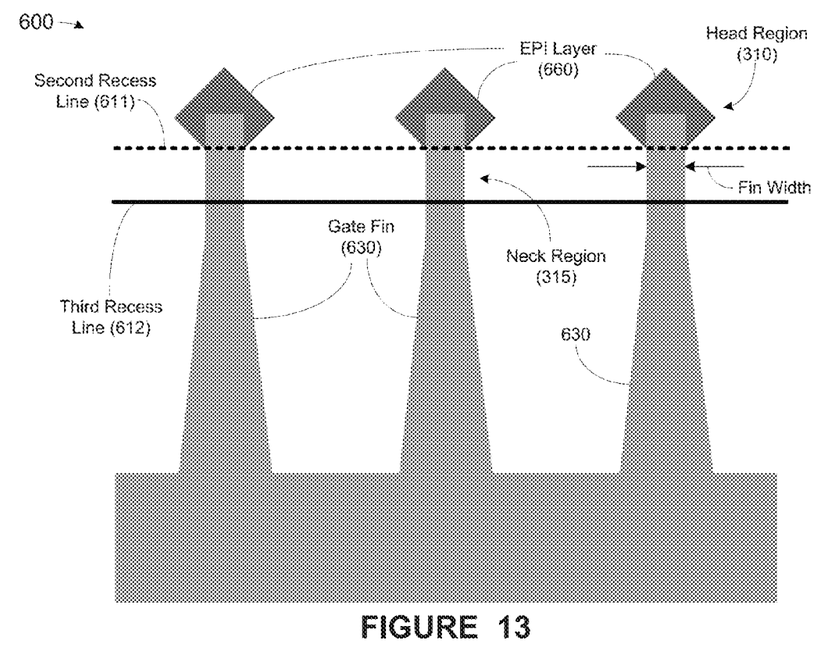

Subsequently, a second recess process may be performed, which provides a lower (third) recess line 612, as shown in FIG. 13. The second recess process may be performed by implementing a wet etch process, a SiCoNi etch process, or a combination of both, which results in exposing a portion of the gate fins 660. The recess exposes a portion of the gate fins 630 below the epitaxy layer 660. The region from the bottom of the epitaxy layer 660 (from the previous recess line 611) to the recess line 612 may be considered the neck region 315 of the gate fins 660. The portion above the neck region 315 may be considered the head region 310 of the gate fins 660.

Figure 14:
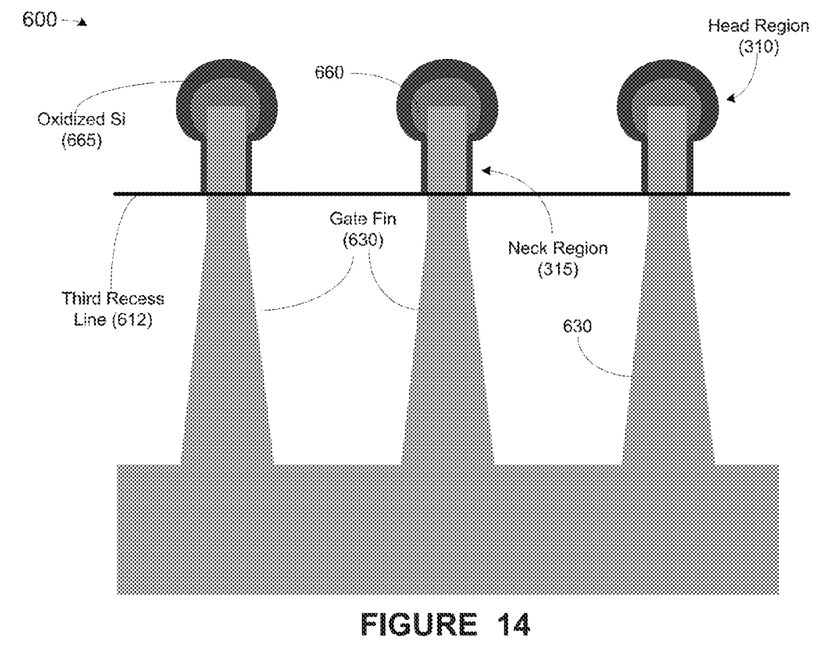

An oxidation step may be performed, resulting in an oxidized silicon layer 665, as shown in FIG. 14. The oxidation step may comprise deposition of a layer of $SiO_2$ over the epitaxy layer 660. Subsequent to the oxidation process, the overall shape of the head region 315 may become more rounded/bulbous.

Figure 15:
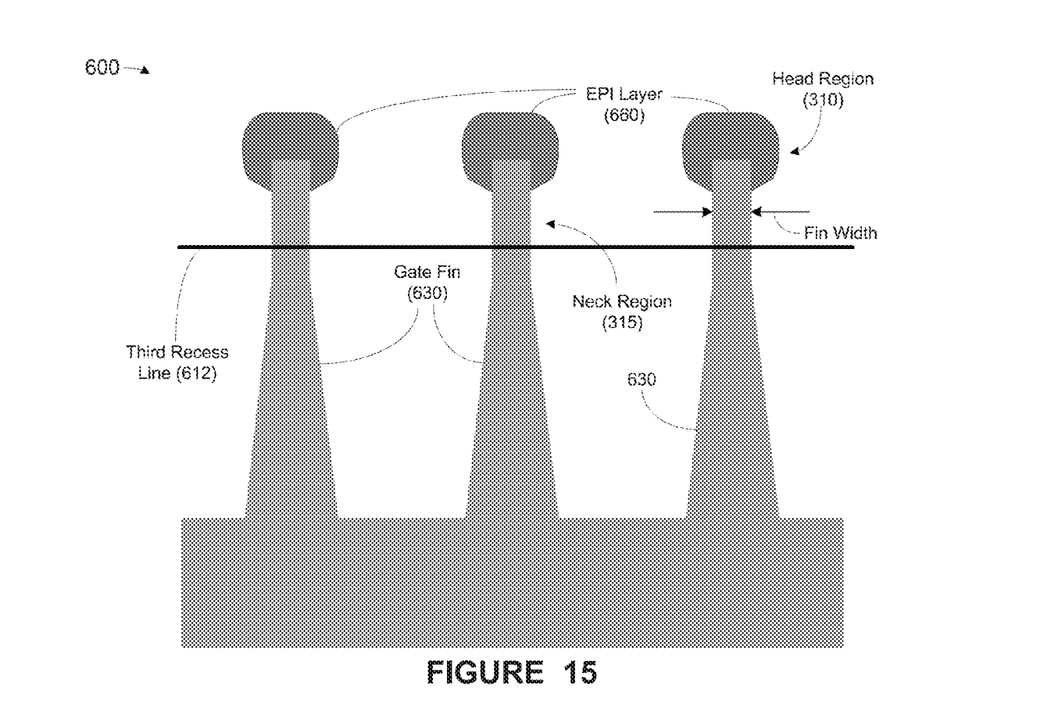

Subsequently, an oxide removal step may be performed, which leaves a more rounded epitaxy layer 660, as illustrated in FIG. 15. For example, an SiCoNi etch process may used for oxide removal. The SiCoNi etch process may comprise providing a gas phase plasma reaction and thermal evaporation to remove oxide. The epitaxy layer 660 becomes part of the gate fins 660, providing gate fins 600 comprising a rounded head region 310, a neck regions 315.

Figure 16:
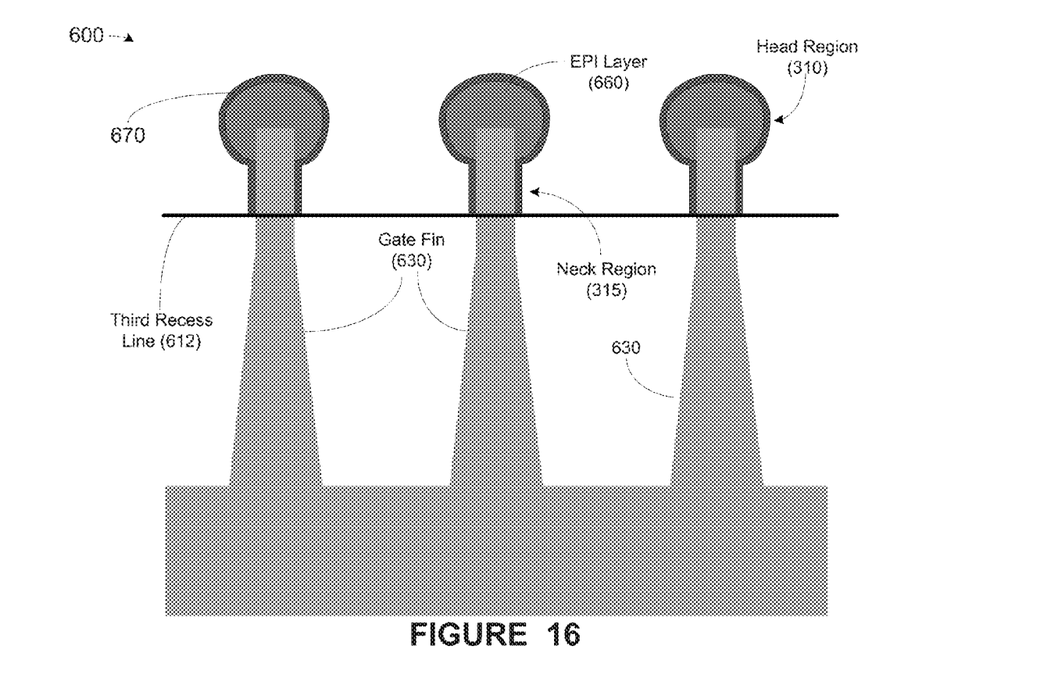

One or more processes know to those skilled in the art may then be performed to form a gate oxide layer 670 on the exposed fin surface (i.e., head region 310 and neck region 315), as illustrated in FIG. 16. This results in gate fins 660 that comprise a rounded head region 310 and a neck region 315 (see FIG. 3), which provides for increased active area without adding to the height dimension of the gate fins 660.

Accordingly, the increased active region of the gate fins 660 provide for finFET devices with higher current drive. It is understood that the FinFET device 600 may undergo further CMOS processes to form various features such as contacts/vias, interconnect metal layers, dielectric layers, passivation layers, source regions, drain regions, etc. Subsequent processing known to those skilled in the art to form a complete finFET device (e.g., patterning, lithography, etch, metal gate, etc.) may be performed to form finFET devices comprising gate fins 660 having the rounded head regions 310 and neck regions 315. Thereby, using the gate fins 660 described above, finFET devices having higher current drive may be provided without increasing the dimension of the finFET devices. In some embodiments, the finFET gate concepts described herein may be utilized with reverse metal gate process. In some embodiments, upon formation of the gate fins described herein, metal gate processing may be performed. The metal gates may comprise Ti, TiN, TiAlC, and/or W materials.

Figure 17:
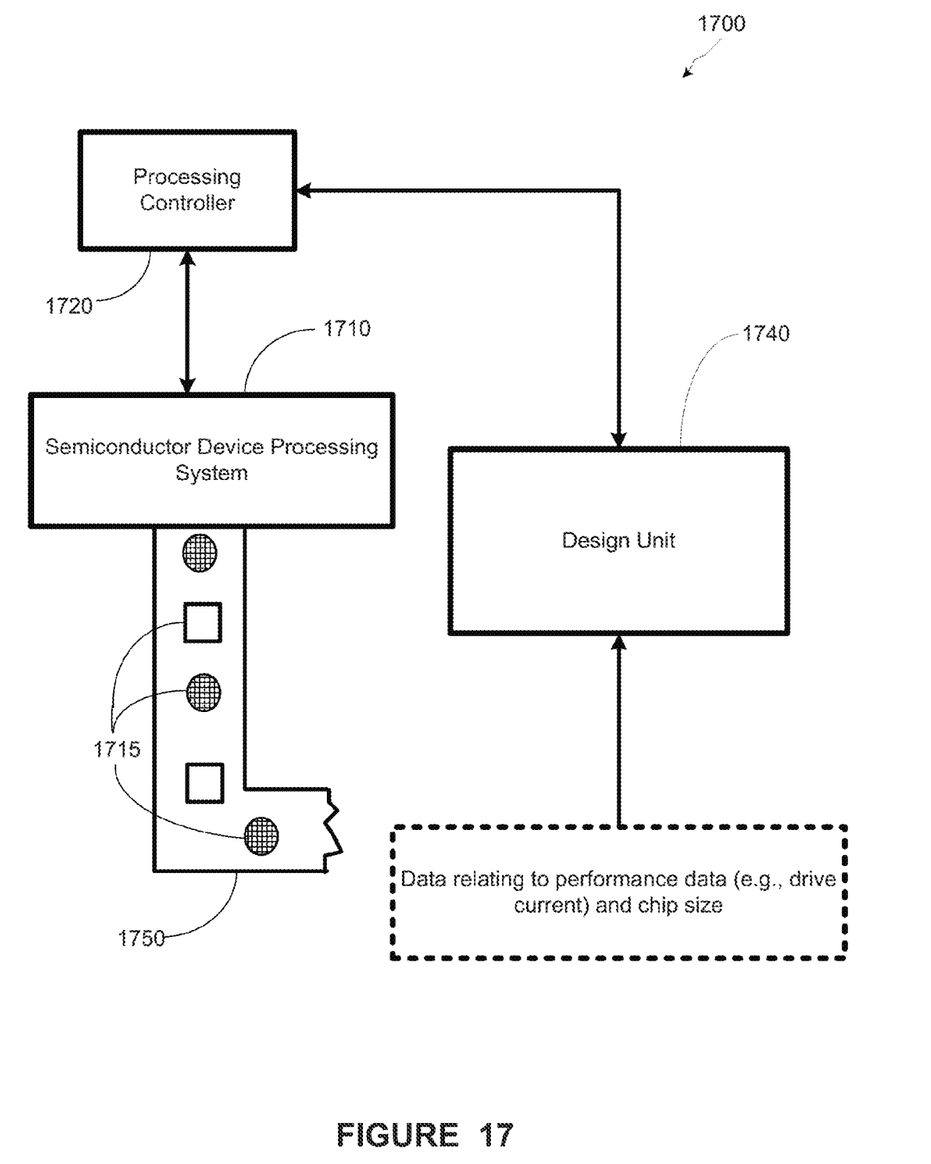
FIG. 17 illustrates a stylized depiction of a system for fabricating a semiconductor device package comprising a topside interconnection substrate, in accordance with embodiments herein.

Turning now to FIG. 17, a stylized depiction of a system for fabricating a semiconductor device package comprising a topside interconnection substrate, in accordance with embodiments herein, is illustrated. The system 1700 of FIG. 17 may comprise a semiconductor device processing system 1710 and a design unit 1740. The semiconductor device processing system 1710 may manufacture integrated circuit devices based upon one or more designs provided by the design unit 1740.

The semiconductor device processing system 1710 may comprise various processing stations, such as etch process stations, photolithography process stations, CMP process stations, etc. One or more of the processing steps performed by the processing system 1710 may be controlled by the processing controller 1720. The processing controller 1720 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1710 may produce integrated circuits on a medium, such as silicon wafers. More particularly, the semiconductor device processing system 1710 produce integrated circuits having finFET devices that comprise gate fins that have a rounded head and/or a neck as described above.

The production of integrated circuits by the device processing system 1710 may be based upon the circuit designs provided by the integrated circuits design unit 1740. The processing system 1710 may provide processed integrated circuits/devices 1715 on a transport mechanism 1750, such as a conveyor system. In some embodiments, the conveyor system may be sophisticated clean room transport systems that are capable of transporting semiconductor wafers. In one embodiment, the semiconductor device processing system 1710 may comprise a plurality of processing steps, e.g., the 1$^{st}$ process step, the 2$^{nd}$ process set, etc., as described above.

In some embodiments, the items labeled "1715" may represent individual wafers, and in other embodiments, the items 1715 may represent a group of semiconductor wafers, e.g., a "lot" of semiconductor wafers. The integrated circuit or device 1715 may be a transistor, a capacitor, a resistor, a memory cell, a processor, and/or the like. In one embodiment, the device 1715 is a transistor and the dielectric layer is a gate insulation layer for the transistor.

The integrated circuit design unit 1740 of the system 1700 is capable of providing a circuit design that may be manufactured by the semiconductor processing system 1710. The integrated circuit design unit 1740 may be capable of determining the number of devices (e.g., processors, memory devices, etc.) to place in a device package. The integrated circuit design unit 1740 may also determine the height of the gate fins, the size of the rounded head regions of the gate fins, the size of the neck regions of the gate fins, etc. These dimensions may be based upon data relating to drive currents/performance metrics, device dimensions, etc. Based upon such details of the devices, the integrated circuit design unit 1740 may determine specifications of the finFETs that are to be manufactured. Based upon these specifications, the integrated circuit design unit 1740 may provide data for manufacturing a semiconductor device package described herein.

The system 1700 may be capable of performing analysis and manufacturing of various products involving various technologies. For example, the system 1700 may design and production data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a fin of a gate of a transistor;
    performing a first recess step for stripping a hard mask material by a first dimension to expose a first portion of said fin;
    forming an epitaxy layer upon said first portion;
    performing a second recess step for further stripping said hard mask material by a second dimension to expose a second portion of said fin;
    performing an oxidation process upon said fin; and
    performing an oxide removal process upon said fin to provide a bulbous shape upon said first portion.

2. The method of claim 1, wherein said second portion provides a neck portion of said fin.

3. The method of claim 1, further comprising depositing a metal over said first and second portions for providing an active region of said transistor.

4. The method of claim 1, further comprising performing an annealing process upon said epitaxy layer.

5. The method of claim 1, wherein forming an epitaxy layer upon said first portion comprises performing at least one of a reduced pressure CVD (RPCVD), ultra-high vacuum CVD (UHVCVD), metal organic CVD (MOCVD).

6. The method of claim 1, wherein forming an epitaxy layer upon said first portion comprises providing a precursor selected from the group consisting of SiH$_4$ gas, Si$_2$H$_4$Cl$_2$ gas, Si$_2$H$_6$ gas, Si$_3$H$_8$ gas and GeH$_4$ gas.

7. The method of claim 1, wherein performing said oxide removal process upon said fin comprises performing a SiCoNi etch process.

8. The method of claim 1, wherein providing bulbous shape upon said first portion comprises providing an increased active area for increasing the drive current of said transistor.

9. The method of claim 1, wherein forming said epitaxy layer upon said first portion comprises:
    determining a width of said fin;
    determining a width of said epitaxy layer based upon said width of said fin, wherein said width of said epitaxy layer is proportional to said width of said fin.

10. The method of claim 1, wherein performing said first recess step for stripping a hard mask material by said first dimension comprises:
    determining a width of said fin;
    determining said first dimension based upon said width of said fin, wherein said width of said first dimension is proportional to said width of said fin.

11. A system, comprising:
    a semiconductor device processing system to manufacture a semiconductor device comprising at least one fin field effect transistor (finFET); and a processing controller operatively coupled to said semiconductor device processing system, said processing controller configured to control an operation of said semiconductor device processing system;

wherein said semiconductor device processing system is adapted to:
  form a fin of a gate of said finFET;
  perform a first recess step for stripping a hard mask material by a first dimension to expose a first portion of said fin;
  form an epitaxy layer upon said first portion;
  performing a second recess step for further stripping said hard mask material by a second dimension to expose a second portion of said fin;
  perform an oxidation process upon said fin; and
  perform an oxide removal process upon said fin to provide a bulbous shape upon said first portion.

12. The system of claim 11, further comprising a design unit configured to generate a first design comprising a definition for a process mask and a definition for an operation of a FinFET device that comprises a gate fin, wherein data from said design unit is used by said process controller to control an operation of said semiconductor device processing system.

13. The system of claim 11, wherein said second portion provides a neck portion of said fin.

14. The system of claim 11, wherein said semiconductor device processing system is further adapted to deposit a metal over said first and second portions for providing an active region of said finFET.

15. The system of claim 11, wherein said bulbous shape provides an increased active area for increasing the drive current of said finFET.

* * * * *